(12) United States Patent
Kim et al.

(10) Patent No.: US 11,482,581 B2
(45) Date of Patent: Oct. 25, 2022

(54) DISPLAY APPARATUS

(71) Applicant: SAMSUNG DISPLAY CO., LTD., Yongin-si (KR)

(72) Inventors: Jinyeong Kim, Yongin-si (KR); Jintaek Kim, Yongin-si (KR); Mijin Park, Yongin-si (KR); Taehoon Yang, Yongin-si (KR); Woonghee Jeong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 122 days.

(21) Appl. No.: 16/901,107

(22) Filed: Jun. 15, 2020

(65) Prior Publication Data

US 2021/0013271 A1 Jan. 14, 2021

(30) Foreign Application Priority Data

Jul. 11, 2019 (KR) .................. 10-2019-0083943

(51) Int. Cl.
*H01L 27/32* (2006.01)
*H01L 51/56* (2006.01)

(52) U.S. Cl.
CPC ........ *H01L 27/326* (2013.01); *H01L 27/3206* (2013.01); *H01L 27/3246* (2013.01); *H01L 51/56* (2013.01); *H01L 2227/323* (2013.01)

(58) Field of Classification Search
CPC .............. H01L 27/326; H01L 27/3206; H01L 27/3246; H01L 51/56; H01L 2227/323
USPC ........................................................ 257/40
See application file for complete search history.

(56) References Cited

U.S. PATENT DOCUMENTS

| | | |
|---|---|---|
| 5,565,742 A | 10/1996 | Shichao |
| 8,330,152 B2 | 12/2012 | So |
| 8,952,998 B2 | 2/2015 | Gu et al. |
| 9,166,166 B2 | 10/2015 | Kim et al. |
| 9,594,286 B2 | 3/2017 | Kim et al. |
| 9,893,134 B2 | 2/2018 | You et al. |
| 9,947,734 B2 | 4/2018 | You et al. |

(Continued)

FOREIGN PATENT DOCUMENTS

| | | |
|---|---|---|
| JP | 5486920 | 7/2011 |
| KR | 10-2014-0088041 | 7/2014 |

(Continued)

*Primary Examiner* — Dzung Tran
(74) *Attorney, Agent, or Firm* — F. Chau & Associates, LLC

(57) ABSTRACT

A display apparatus includes a substrate having a first transmissive area, a second transmissive area, a pixel area between the first transmissive area and the second transmissive area, a first pixel electrode in the pixel area, a first intermediate layer disposed on the first pixel electrode to emit light of a first color and an insulating layer covering edges of the first pixel electrode and defining a first emission area through a first opening exposing a portion of the first pixel electrode. A first partition wall is disposed on the insulating layer between the first emission area and the first transmissive area. A second partition wall is disposed on the insulating layer between the first emission area and the second transmissive area. An opposite electrode is disposed on the first intermediate layer in the pixel area and partially contacts the first partition wall and the second partition wall.

19 Claims, 15 Drawing Sheets

(56) References Cited

U.S. PATENT DOCUMENTS

| | | | | |
|---|---|---|---|---|
| 2009/0321725 | A1* | 12/2009 | Yoshida | H01L 27/1214 257/E21.414 |
| 2015/0091785 | A1* | 4/2015 | Lee | H01L 27/3218 345/77 |
| 2016/0013441 | A1* | 1/2016 | Hong | H01L 27/3276 257/40 |
| 2016/0079333 | A1* | 3/2016 | Shishido | G02F 1/136286 257/72 |
| 2016/0126494 | A1* | 5/2016 | Jung | H01L 27/3246 438/23 |
| 2016/0240603 | A1* | 8/2016 | Park | G09G 3/3233 |
| 2017/0186827 | A1* | 6/2017 | You | H01L 27/3258 |
| 2020/0212159 | A1* | 7/2020 | Lee | H01L 51/5237 |

FOREIGN PATENT DOCUMENTS

| | | |
|---|---|---|
| KR | 10-2014-0124285 | 10/2014 |
| KR | 10-2016-0139115 | 12/2016 |
| KR | 10-2017-0078909 | 7/2017 |
| KR | 10-1763442 | 7/2017 |
| KR | 10-1923173 | 11/2019 |

* cited by examiner

1

DISPLAY APPARATUS

CROSS-REFERENCE TO RELATED APPLICATION

This application claims priority under 35 U.S.C. § 119 to Korean Patent Application No. 10-2019-0083943, filed on Jul. 11, 2019, in the Korean Intellectual Property Office, the disclosure of which is incorporated by reference in its entirety herein.

1. Technical Field

One or more exemplary embodiments relate to a display apparatus, and more particularly, to a display apparatus including a transmissive area in a display area, wherein the transmittance of the display area and the distortion of a color gamut are simultaneously improved.

2. Discussion of Related Art

Display apparatuses have been incorporated into a wide variety of electronic devices. The recent size and weight reduction of display apparatuses have broadened the types of electronic devices that include display apparatuses. Among the different types of display apparatuses, an organic light-emitting display apparatus provides wide viewing angles, good contrast, and a fast response speed and thus has drawn attention as a next-generation display apparatus.

An organic light-emitting display apparatus includes a plurality of pixel units having (sub)pixels which include an organic light-emitting diode. The organic light-emitting diode includes an intermediate layer having an emission layer between a pixel electrode and an opposite electrode. In such an organic light-emitting display apparatus, the emission and the degree of emission of each pixel may be controlled by using a thin film transistor that is electrically connected to the pixel electrode. The opposite electrode is integrally formed over a plurality of (sub)pixels.

The emission layers may be patterned and deposited by using masks, for example, fine metal masks (FMMs), that are open for respective sub-pixels. However, in an existing display apparatus, when a pattern layer is deposited using a mask having an opening corresponding to a pattern area, a shadow area may be formed due to a deposition material propagating to a space between an uppermost layer and the mask. Therefore, the deposition material is also deposited outside of the pattern area.

SUMMARY

One or more exemplary embodiments include a display apparatus including a transmissive area in a display area, wherein the transmittance of the display area and the distortion of a color gamut are simultaneously improved. However, this is merely an example, and the exemplary embodiments of the present inventive concepts are not limited thereto.

Additional aspects will be set forth in part in the description which follows and, in part, will be apparent from the description, or may be learned by practice of the presented embodiments of the disclosure.

According to one or more exemplary embodiments, a display apparatus includes a substrate including a first transmissive area, a second transmissive area, and a pixel area between the first transmissive area and the second transmissive area. A first pixel electrode is in the pixel area. A first intermediate layer is disposed on the first pixel electrode. The first intermediate layer is configured to emit light of a first color. An insulating layer covers edges of the first pixel electrode and defines a first emission area through a first opening exposing a portion of the first pixel electrode. A first partition wall is disposed on the insulating layer between the first emission area and the first transmissive area. A second partition wall is disposed on the insulating layer between the first emission area and the second transmissive area. An opposite electrode is disposed on the first intermediate layer in the pixel area, the opposite electrode partially contacts the first partition wall and the second partition wall.

An upper surface of the first partition wall may include a first portion adjacent to the first emission area and a second portion adjacent to the first transmissive area, and the first portion may contact the opposite electrode.

The second portion may not overlap the opposite electrode.

The display apparatus may further include a material layer disposed on the opposite electrode, and the second portion may directly contact the material layer.

The display apparatus may further include a second pixel electrode that is apart from the first pixel electrode in the pixel area in a first direction, a second intermediate layer disposed on the second pixel electrode and emitting light of a second color, a third pixel electrode that is apart from the second pixel electrode in the pixel area in the first direction, and a third intermediate layer disposed on the third pixel electrode and emitting light of a third color, wherein the insulating layer may cover edges of the second and third pixel electrodes and may define a second emission area and a third emission area through a second opening and a third opening which expose central portions of the second and third pixel electrodes, and the first partition wall may extend between the third emission area and the first transmissive area in the first direction.

The second partition wall may extend between the third emission area and the second transmissive area in the first direction.

A length of the first partition wall in the first direction may be the same as a length of the second partition wall.

Lengths of the first and second partition walls in the first direction may be less than or equal to about 300 μm.

Widths of the first and second partition walls in a second direction may be identical, the second direction crossing the first direction.

The widths of the first and second partition walls in the first direction may be less than or equal to about 30 μm.

Heights of the first and second partition walls may be less than or equal to about 3.5 μm.

The display apparatus may further include a first supportive partition wall disposed on the insulating layer between the first opening and the second opening, in a second direction crossing the first direction.

The display apparatus may further include a second supportive partition wall disposed on the insulating layer between the second opening and the third opening, in the second direction.

The opposite electrode may cover the first supportive partition wall and the second supportive partition wall.

The first supportive partition wall may extend in the second direction and may be connected to the first partition wall at one side and to the second partition wall at the other side.

In the pixel area, at least one pixel portion including a plurality of light-emitting diodes emitting light of different colors may be disposed, and the plurality of light-emitting diodes may include a first light-emitting diode including the first pixel electrode, a second light-emitting diode including the second pixel electrode, and a third light-emitting diode including the third pixel electrode.

The pixel portion may include a first pixel portion and a second pixel portion that are in the first direction, and the display apparatus may further include a third supportive partition wall disposed on the insulating layer between the first pixel portion and the second pixel portion, in the second direction.

The first partition wall and the second partition wall may respectively correspond to the first pixel portion and the second pixel portion.

The display apparatus may further include a multilayer disposed between the insulating layer and the substrate and including at least one of an organic insulating layer and an inorganic insulating layer, and the multilayer may include an open region corresponding to the first and the second transmissive areas, respectively.

There may be a plurality of first transmissive areas and a plurality of second transmissive areas in the first direction with the pixel area between the plurality of first transmissive areas and the plurality of second transmissive areas, the pixel area extending in the first direction, and the opposite electrode may be integrally formed in the pixel area between the plurality of first transmissive areas and the plurality of second transmissive areas.

In an exemplary embodiment, a method for manufacturing a display apparatus, includes forming a substrate comprising a first transmissive area, a second transmissive area, and a pixel area between the first transmissive area and the second transmissive area. A pixel electrode is formed in the pixel area. An intermediate layer is formed on the pixel electrode, the intermediate layer is configured to emit light. An insulating layer is formed covering edges of the pixel electrode and defining an emission area through an opening exposing a portion of the pixel electrode. A first partition wall and a second partition wall is formed having first portions and second portions on the insulating layer. A mask is formed that is supported on the second portions of the first partition wall and the second partition wall. An opposite electrode is formed on the intermediate layer by depositing a deposition material on an open region of the mask, the open region of the mask including the first portions of the first partition wall and second partition wall.

In an exemplary embodiment, a display apparatus includes a substrate comprising a first transmissive area, a second transmissive area, and a pixel area between the first transmissive area and the second transmissive area. The pixel area includes at least one pixel portion having a plurality of light-emitting diodes configured to emit light of different colors. The plurality of light-emitting diodes is spaced apart in a first direction. Each of the plurality of light-emitting diodes includes a pixel electrode, an intermediate layer disposed on the pixel electrode, an insulating layer covering edges of the pixel electrode and defining an emission area through an opening exposing a portion of the pixel electrode and an opposite electrode disposed on the intermediate layer in the pixel area. Supportive partition walls are disposed on the insulating layer between openings of adjacent light-emitting diodes in the first direction. The supportive partition walls extend in a second direction that crosses the first direction.

In addition to the aforesaid details, other aspects, features, and advantages will be clarified from the detailed description, claims, and drawings.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF EXEMPLARY EMBODIMENTS

Figure 1A:
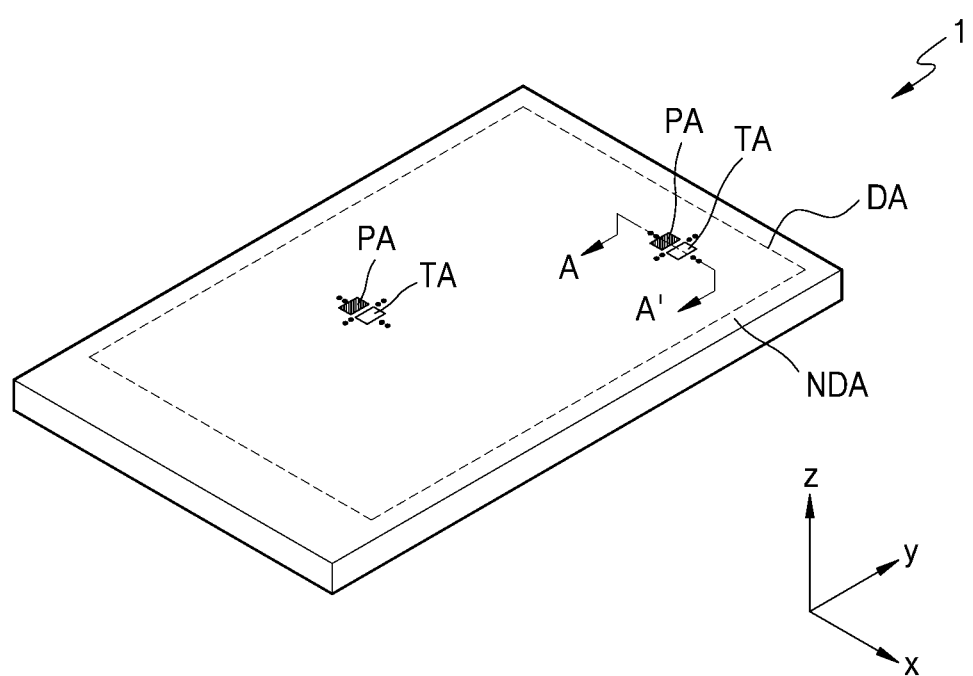
FIG. 1A is a perspective view of a display apparatus according to an embodiment of the present inventive concepts.

Reference will now be made in detail to exemplary embodiments of the present inventive concepts which are illustrated in the accompanying drawings, wherein like reference numerals refer to like elements throughout. In this regard, the exemplary embodiments may have different forms and should not be construed as being limited to the descriptions set forth herein. Accordingly, the exemplary embodiments are merely described below, by referring to the figures, to explain aspects of the present inventive concepts. As used herein, the term "and/or" includes any and all combinations of one or more of the associated listed items. Expressions such as "at least one of," when preceding a list of elements, modify the entire list of elements and do not modify the individual elements of the list.

The disclosure will now be described more fully with reference to the accompanying drawings, in which exemplary embodiments of the present inventive concepts are shown. Like reference numerals in the drawings denote like elements, and thus their description will be omitted It will be understood that although the terms "first," "second," etc. may be used herein to describe various components, these components should not be limited by these terms, and these components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. For example, intervening layers, regions, or components may be present.

Sizes of components in the drawings may be exaggerated for convenience of explanation. In other words, since sizes and thicknesses of components in the drawings are arbitrarily illustrated for convenience of explanation, the following exemplary embodiments are not limited thereto.

When a certain embodiment may be implemented differently, a specific process order may be performed differently from the described order. For example, two consecutively described processes may be performed substantially at the same time or performed in an order opposite to the described order.

In the present specification, the expression "A and/or B" indicates A or B or A and B. In addition, the expression "at least one of A and B" indicates A or B or A and B.

It will be understood that when a layer, region, or component is referred to as being connected to another layer, region, or component, it can be directly connected to the other layer, region, or component and/or intervening layers, regions, or components may be present. For example, when a layer, region, or component is referred to as being electrically connected to another layer, region, or component, it can be directly electrically connected to the other layer, region, or component and/or intervening layers, regions, or components may be present.

FIG. 1A is a schematic perspective view of a display apparatus 1 according to an exemplary embodiment, and FIG. 113 is a schematic perspective view of a display apparatus 1' according to an exemplary embodiment.

Referring to FIG. 1A, the display apparatus 1 includes a display area DA in which images are displayed and a non-display area NDA in which images are not displayed. Pixels may be arranged in the display area DA and may emit light to provide images to the viewer. The non-display area NDA may be outside of the display area DA and surround the same. For example, as shown in the embodiment of FIG. 1A, the display area DA may have a rectangular shape having relatively longer sides extending in the Y direction and having relatively shorter sides extending in the X direction. The non-display area NDA may be arranged outside of the display area (e.g., in the X and/or Y direction) and may surround the display area. For example, in the embodiment of FIG. 1A, the non-display area NDA surrounds the display area DA on four sides. However, in other exemplary embodiments, the display area DA may have a variety of other shapes, such as a circle, an oval, a polygon, etc. and the non-display area NDA may have various different shapes and orientations with respect to the display area DA.

The display area DA may include a pixel area PA and a transmissive area TA. For example, the display area DA may include a plurality of pixel areas PA and a plurality of transmissive areas TA that are arranged with respect to each other. The pixel area PA is an area in which the pixels are arranged and light is substantially emitted. In an exemplary embodiment, the pixels in the pixel area PA may be arranged in stripes, a pen-tile matrix, etc. The transmissive area TA is an area where the pixels are not arranged and light that penetrates a substrate 100 may pass, such as incident external light, light from a component, etc. The transmissive area TA may include an organic layer and/or an inorganic layer. In an exemplary embodiment, the transmissive area TA may include a substrate 100, and layers that may be initially formed on the substrate 100 may all be removed. In another exemplary embodiment, the substrate 100 may be disposed in the transmissive area TA and an inorganic layer such as a buffer layer may only be disposed on the substrate 100.

Referring to FIG. 1A, the transmissive area TA may be disposed throughout the display area DA. As described above, the transmissive area TA is an area where light penetrates. The display area DA of the display apparatus 1 displays images and may be transparent. For example, a front surface of the display area DA of the display apparatus 1 may be embodied as a transparent display.

Figure 1B:
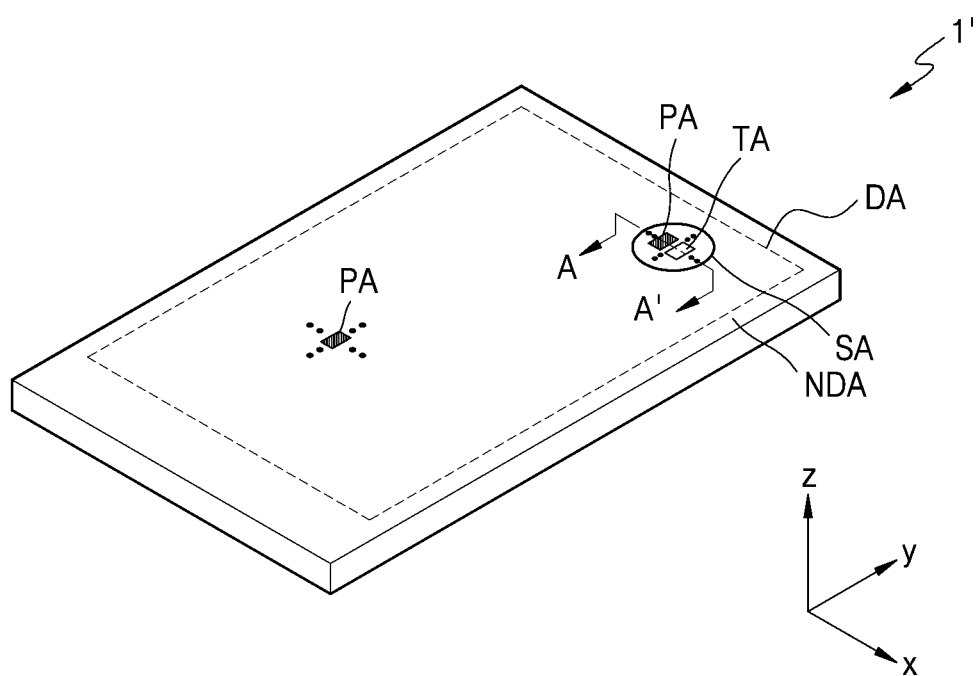
FIG. 1B is a perspective view of a display apparatus according to an embodiment of the present inventive concepts.

In the embodiment shown in FIG. 1B, the display apparatus includes a supportive display area SA that is disposed in the display area DA. The transmissive area TA may be disposed in the supportive display area SA. In the embodiment shown in FIG. 1B, the supportive display area SA may be circular. However, exemplary embodiments of the present inventive concepts are not limited thereto. The supportive display area SA may be surrounded by the display area DA.

The supportive display area SA may include a component such as a sensor using infrared rays, visible rays, sound, or the like disposed thereunder (e.g., in the Z direction). The transmissive area TA may be an area which permits light and/or sound that is emitted from a component to the outside or propagates from the outside to the component, to penetrate the transmissive area. In an exemplary embodiment, when light, such as infrared rays, penetrates through the supportive display area SA, the light transmittance may be equal to or greater than about 10%. For example, in exemplary embodiments, the light transmittance in the supportive display area SA may be about 20%, 25%, 50%, 85%, or 90%.

In an exemplary embodiment, the number of pixels arranged in the supportive display area SA per unit area may be less than the number of pixels arranged in the display area DA.

In the embodiment of FIG. 1B, the supportive display area SA is on a side (e.g., an upper right side) of the display area DA. However, exemplary embodiments of the present inventive concepts are not limited thereto and the locations and the number of supportive display areas SA disposed in the display area DA may vary.

Hereinafter, for convenience of explanation, an embodiment in which the display apparatus 1 is an organic light-emitting display apparatus is described. However, exemplary embodiments of the present inventive concepts are not limited thereto and the display apparatus may be various types of display apparatuses including an inorganic light-emitting display apparatus (or an inorganic EL display apparatus), a quantum dot light-emitting display apparatus, etc. For example, an emission layer of a display element of the display apparatus 1 may include organic materials, inorganic materials, or quantum dots, or both organic materials and quantum dots, or inorganic materials and quantum dots, etc.

Figure 2:
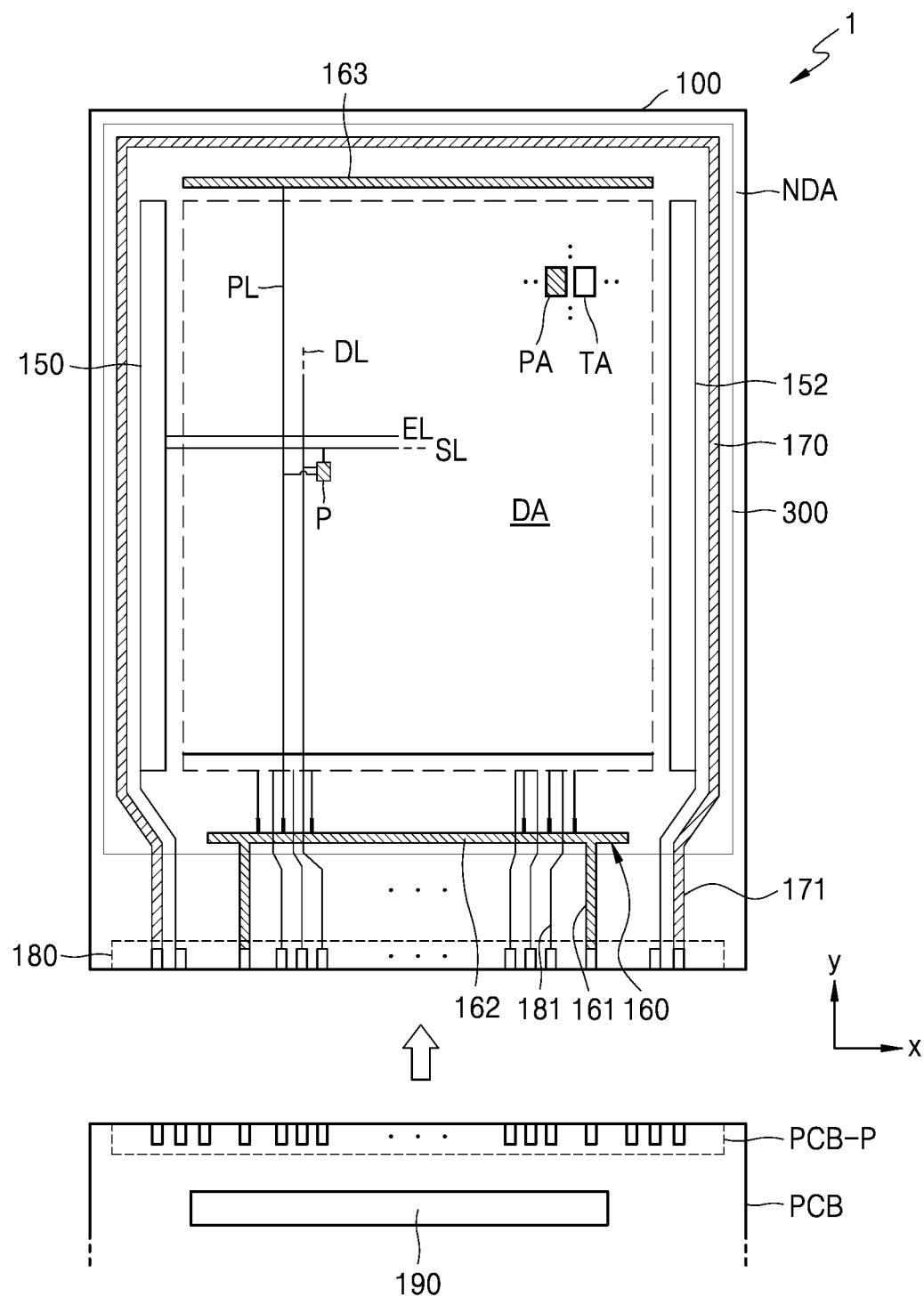
FIG. 2 is a top plan view of a display apparatus according to an embodiment of the present inventive concepts.

FIG. 2 is a schematic plan view of the display apparatus according to an embodiment of the present inventive concepts.

Referring to FIG. 2, various components of the display apparatus 1 are arranged on the substrate 100. In an exemplary embodiment, the substrate 100 may include a glass material, a metallic material, or a plastic material. In an embodiment in which the substrate 100 includes a plastic material, the substrate 100 may include, for example, a polymer resin including at least one compound selected from polyethersulfone, polyacrylate, polyetherimide polyethylene naphthalate, polyethylene terephthalate, polyphenylene sulfide, polyarylate, polyimide, polycarbonate, cellulose acetate propionate, etc. The substrate 100 including a plastic material may be flexible, rollable, or bendable.

The substrate 100 includes the display area DA and the non-display area NDA surrounding the display area DA. The display area DA may be an area where images are displayed. The display area DA includes the pixel area PA in which the pixels P are arranged, and the transmissive area TA, where the pixels P are not arranged and which is translucent.

The pixels P are arranged in the pixel area PA of the display area DA. Each pixel P may include a display element such as a light-emitting diode. In the embodiment of FIG. 2, the display element is an organic light-emitting diode (OLED). Each pixel P may emit light of a particular color, such as red, green, blue, or white, from the OLED. In the specification, the pixel P may be a pixel emitting any one of red, green, blue, and white light, as described above. However exemplary embodiments of the present inventive concepts are not limited thereto.

The display area DA may be covered by a thin film encapsulation layer 300 to protect the display elements from contaminants, such as external air, moisture, or the like.

The pixels P may be electrically connected to outer circuits arranged in the non-display area NDA, respectively. As shown in the embodiment of FIG. 2, a first scan driving circuit 150, a second scan driving circuit 152, a first power supply line 160, a second power supply line 170, a pad unit 180, and a data driving circuit 190 may be arranged in the non-display area NDA. However, exemplary embodiments of the present inventive concepts are not limited thereto and the display apparatus 1 may include different components in the non-display area NDA and the arrangement of the components may be different.

The first scan driving circuit 150 may provide a scan signal to each pixel P through a scan line SL. The first scan driving circuit 150 may provide an emission control signal to each pixel P through an emission control line EL. The first scan driving circuit 150 may extend in the Y direction and may be disposed on a left side (e.g., in the X direction) of the non-display area NDA. The second scan driving circuit 152 may extend in the Y direction and may be disposed on a right side (e.g., in the X direction) of the non-display area NDA. The second scan driving circuit 152 may be in parallel with the first scan driving circuit 150 with the display area DA therebetween. In an exemplary embodiment, some of the pixels P arranged in the display area DA may be electrically connected to the first scan driving circuit 150, and others thereof may be electrically connected to the second scan driving circuit 152. In another exemplary embodiment, the second scan driving circuit 152 may be omitted.

The first power supply line 160 may include a first sub-line 162 and a second sub-line 163 that extend in parallel with each other in an X direction and are disposed with the display area DA therebetween. For example, as shown in the embodiment of FIG. 2, the first sub-line 162 may be disposed on a bottom side of the non-display area NDA (e.g., in the Y direction) and the second sub-line 163 may be disposed on a top side of the non-display area NDA (e.g., in the Y direction). A shape of the second power supply line 170 may be a loop of which a portion is open, and the second power supply line 170 may partially surround the display area DA.

The pad unit 180 may be on a side of the substrate 100. For example, as shown in the embodiment of FIG. 2, the pad unit 180 may be disposed on a bottom side of the substrate (e.g., in the Y direction). The pad unit 180 may not be covered by an insulating layer and may be electrically connected to a printed circuit board PCB. A pad unit PCB-P of the printed circuit board PCB may be electrically connected to the pad unit 180 of the display apparatus 1. The printed circuit board PCB transmits signals from a controller or power to the display apparatus 1.

Figure 3:
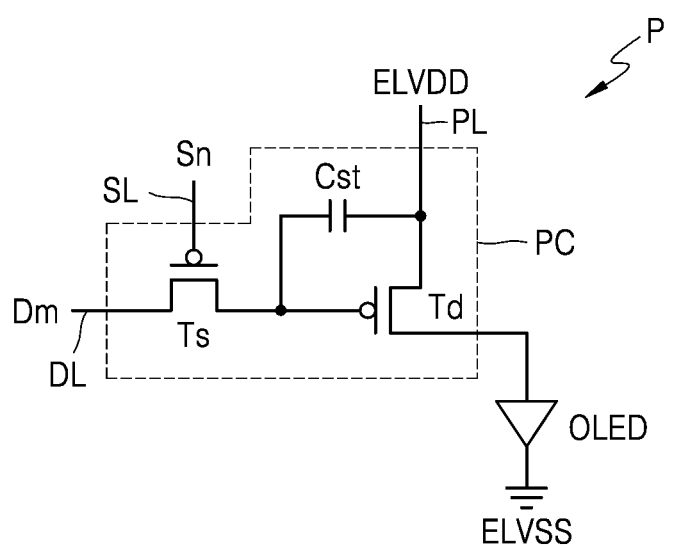
FIG. 3 is an equivalent circuit diagram of a pixel that may be included in a display apparatus, according to an embodiment of the present inventive concepts.

Control signals generated from the controller may be respectively transmitted to the first and second scan driving circuits 150 and 152 through the printed circuit board PCB. The controller may provide first and second power ELVDD and ELVSS (as shown in FIG. 3) to the first and second power supply lines 160 and 170 through first and second connection lines 161 and 171, respectively. The first power voltage ELVDD may be provided to each pixel P through a driving voltage line PL connected to the first power supply line 160, and the second power voltage ELVSS may be provided to an opposite electrode of each pixel P, which is connected to the second power supply line 170.

The data driving circuit 190 is electrically connected to a data line DL. A data signal of the data driving circuit 190 may be provided to each pixel P through a connection line 181 connected to the pad unit 180 and the data line DL connected to the connection line 181. In the embodiment of FIG. 2, the data driving circuit 190 is disposed on the printed circuit board PCB. However, in another exemplary embodiment, the data driving circuit 190 may be disposed on the substrate 100. For example, the data driving circuit 190 may be disposed between the pad unit 180 and the first power supply line 160 (e.g., in the Y direction).

FIG. 3 is an equivalent circuit diagram of a pixel that may be included in a display apparatus, according to an embodiment of the present inventive concepts.

Referring to FIG. 3, each pixel P includes a pixel circuit PC connected to the scan line SL and the data line DL and a light-emitting diode OLED connected to the pixel circuit PC.

The pixel circuit PC includes a driving thin film transistor Td, a switching thin film transistor Ts, and a storage capacitor Cst. The switching thin film transistor Ts is connected to the scan line SL and the data line DL. In response to a scan signal Sn input through the scan line SL, the switching thin film transistor Ts transmits, to the driving thin film transistor Td, a data signal Dm input through the data line DL.

The storage capacitor Cst is connected to the switching thin film transistor Ts and the driving voltage line PL and stores a voltage corresponding to a difference between a voltage from the switching thin film transistor Ts and the first power voltage ELVDD (or a driving voltage) provided to the driving voltage line PL.

The driving thin film transistor Td may be connected to the driving voltage line PL and the storage capacitor Cst and may control a driving current flowing in the light-emitting diode OLED from the driving voltage line PL according to a value of the voltage stored in the storage capacitor Cst. The light-emitting diode OLED may emit light having a certain brightness according to the driving current.

FIG. 3 illustrates that the pixel circuit PC includes two thin film transistors and one storage capacitor. However, exemplary embodiments of the present inventive concepts are not limited thereto. For example, in another exemplary embodiment, the pixel circuit PC may include seven thin film transistors and one storage capacitor. In another exemplary embodiment, the pixel circuit PC may include at least two storage capacitors. Furthermore, while the embodiment of FIG. 3 includes single gate electrodes for the switching thin film transistor Ts and the driving thin film transistor Td, in other exemplary embodiments, one or more gate electrodes may be dual gate electrodes, etc.

Figure 4A:
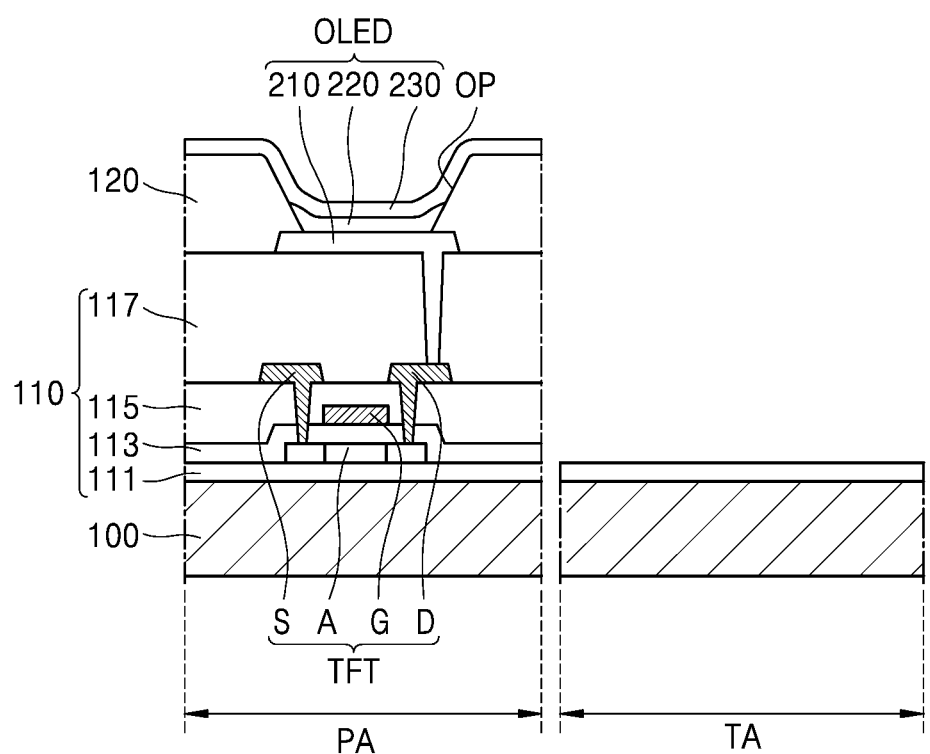
FIGS. 4A and 4B are cross-sectional views of part of a display apparatus, according to exemplary embodiments of the present inventive concepts.
Figure 4B:
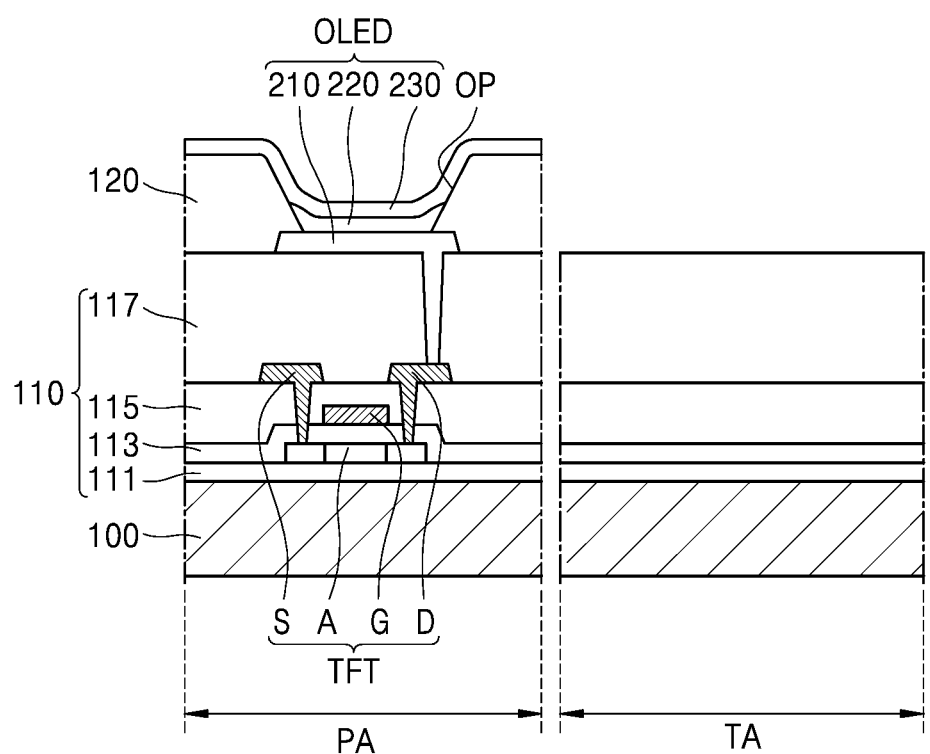

FIGS. 4A and 4B are schematic cross-sectional views of part of a display apparatus, according to exemplary embodiments. FIGS. 4A and 4B illustrate cross-sections of the pixel area PA and the transmissive area TA according to an exemplary embodiment.

A pixel circuit that includes a thin film transistor TFT and a light-emitting diode OLED electrically connected to the pixel circuit may be disposed in the pixel area PA.

A buffer layer 111 may be disposed on the substrate 100 in the pixel area PA. For example, as shown in the embodiment of FIG. 4A, the buffer layer 111 may be disposed directly on the substrate 100 (e.g., in the Z direction). The buffer layer 111 may decrease or prevent the penetration of impurities, moisture, or air from the bottom thereof and may provide a flat surface on the substrate 100. In an exemplary embodiment, the buffer layer 111 may include an inorganic material such as an oxide or nitride, an organic material, or an organic/inorganic composite and may have a single-layer structure or a multilayer structure including an inorganic material and an organic material.

A semiconductor layer A may be on the buffer layer 111. For example, as shown in the embodiment of FIG. 4A, the semiconductor layer A may be disposed directly on the buffer layer 111 (e.g., in the Z direction). In an exemplary embodiment, the semiconductor layer A may include at least one compound selected from amorphous silicon (a-Si), polysilicon, an oxide semiconductor, and an organic semiconductor material. For example, the oxide semiconductor may include indium (In), gallium (Ga), stannum (Sn), zirconium (Zr), vanadium (V), hafnium (Hf), cadmium (Cd), germanium (Ge), chromium (Cr), titanium (Ti), zinc (Zn), indium gallium zinc oxide (IGZO), zinc tin oxide (ZTO), and/or zinc indium oxide (ZIO). For example, polysilicon may include low temperature polysilicon (LTPS). A polysilicon material consumes a small amount of energy and has good reliability because of high electron mobility (at least 100 cm$^2$/Vs), and thus the polysilicon material may be used as a semiconductor layer of a thin film transistor in the display apparatus.

A gate electrode G may be disposed above the semiconductor layer A with a gate insulating layer 113 therebetween (e.g., arranged in the Z direction). In an exemplary embodiment, the gate insulating layer 113 may include at least one compound selected from silicon oxide (SiO$_x$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), zinc oxide (ZnO$_2$), etc.

In an exemplary embodiment, the gate electrode G may include at least one compound selected from molybdenum (Mo), aluminum (Al), copper (Cu), titanium (Ti), etc., and may include a layer or layers. The gate electrode G may include metal having low resistance, and in an exemplary embodiment, the gate electrode G may include a single layer including Mo.

A source electrode S and/or a drain electrode D are disposed above the gate electrode G with an interlayer insulating layer 115 therebetween (e.g., arranged in the Z direction). In an exemplary embodiment, the source electrode S and/or the drain electrode D may include at least one compound selected from Mo, Al, Cu, Ti, etc. and may include a single layer or a plurality of layers. In an exemplary embodiment, the source electrode S and/or the drain electrode D may have a multilayer structure of, for example, Ti/Al/Ti or titanium nitride (TiN)/Al/Ti.

A planarization layer 117 may cover an upper surface of the source electrode S and/or the drain electrode D and may have a flat upper surface to enable a pixel electrode 210 disposed thereon to be flat. For example, as shown in the embodiment of FIG. 4A, the planarization layer 117 may be disposed directly on (e.g., in the Z direction) the source electrode S and the drain electrode D and the portions of the interlayer insulating layer 115 not covered by the electrodes. The planarization layer 117 may include a layer or layers including an organic material.

In an exemplary embodiment, the planarization layer 117 may include a general-purpose polymer such as at least one compound selected from benzocyclobutene (BCB), polyimide, hexamethyldisiloxane (HMDSO), polymethylmethacrylate (PMMA) or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

In an exemplary embodiment, the planarization layer 117 may include an inorganic material. For example, the planarization layer 117 may include at least one compound selected from silicon oxide (SiO$_x$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), zinc oxide (ZnO$_2$), etc. In an embodiment in which the planarization layer 117 includes an inorganic material, chemical polishing may be performed to planarize the planarization layer. In an exemplary embodiment, the planarization layer 117 may include both an organic material and an inorganic material.

The buffer layer 111, the gate insulating layer 113, the interlayer insulating layer 115, and the planarization layer 117 may form a multilayer 110 disposed between the substrate 100 and the light-emitting diode OLED. However, in an exemplary embodiment, the multilayer 110 may include other organic layers and/or inorganic layers other than the buffer layer 111, the gate insulating layer 113, the interlayer insulating layer 115, and the planarization layer 117, and some layers may be omitted.

On the planarization layer 117, the light-emitting diode OLED (e.g., an organic light-emitting diode) including the pixel electrode 210, an intermediate layer 220, and an opposite electrode 230 may be disposed as a display element.

The pixel electrode 210 may be on the planarization layer 117. For example, as shown in the embodiment of FIG. 4A, the pixel electrode 210 may be disposed directly on the planarization layer 117 (e.g., in the Z direction). The embodiment of FIG. 4A includes one pixel electrode 210. However, in other exemplary embodiments, the number of OLEDs may vary and there may be a plurality of pixel electrodes 210 that are spaced apart from each other and patterned according to the number of OLEDs.

In an exemplary embodiment, the pixel electrode 210 may include a (semi-) transmissive electrode or a reflective electrode. For example, the pixel electrode 210 may include a reflective layer including at least one compound selected from silver (Ag), magnesium (Mg), aluminum (Al), platinum (Pt), palladium (Pd), gold (Au), nickel (Ni), neodymium (Nd), iridium (Ir), chromium (Cr), and a combination thereof and may include a transparent or translucent electrode layer formed on the reflective layer. The transparent or translucent electrode layer may include at least one compound selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In an exemplary embodiment, the pixel electrode 210 may have a stack structure of ITO/Ag/ITO.

An insulating layer 120 (e.g., a pixel-defining layer) may be disposed on the planarization layer 117. For example, as shown in the embodiment of FIG. 4A, the insulating layer 120 may be disposed directly on the planarization layer 117 (e.g., in the third direction) and lateral edges of the pixel electrode 210. The insulating layer 120 may cover lateral edges of the pixel electrode 210 and define an emission area of a pixel by having an opening OP exposing a central portion of the pixel electrode 210. The insulating layer 120 may prevent arcs, etc. from being generated at the edges of the pixel electrode 210 by increasing a distance between the edges of the pixel electrode 210 and the opposite electrode 230 on an upper portion of the pixel electrode 210. In an exemplary embodiment, the insulating layer 120 may include an organic insulating material such as at least one compound selected from polyimide, polyamide, acryl resin, BCB, HMDSO, and phenol resin and may be formed by using spin coating, etc.

The intermediate layer 220 of the OLED may include an organic emission layer. The organic emission layer may include an organic material including a fluorescent or phosphorous material emitting red, green, blue, or white light. In an exemplary embodiment, the organic emission layer may include a low-molecular weight organic material or a polymer organic material, and functional layers such as a hole transport layer (HTL), a hole injection layer (HIL), an electron transport layer (ETL), and an electron injection layer (EIL) may be selectively disposed on and under the organic emission layer. The organic emission layer may be disposed respectively corresponding to the pixel electrodes 210 (e.g., overlapping the pixel electrodes in the Z direction), and the above functional layers may be integrally formed over the pixel electrodes 210 (e.g., in the Z direction).

The opposite electrode 230 may be disposed on the intermediate layer 220. In an exemplary embodiment, the opposite electrode 230 may include a light-transmissive electrode or a reflective electrode. For example, in an exemplary embodiment, the opposite electrode 230 may include a metallic thin film having a small work function and including at least one compound selected from Li, Ca, Al, Ag, Mg, LiF/Ca, LiF/Al, and a combination thereof.

In an exemplary embodiment, a transparent conductive oxide (TCO) film such as ITO, IZO, ZnO, or $In_2O_3$ may further be disposed on the metallic thin film.

In exemplary embodiments in which the pixel electrode 210 includes a reflective electrode and the opposite electrode 230 includes a light-transmissive electrode, light emitted from the intermediate layer 220 is emitted towards the opposite electrode 230, and thus, the display apparatus may be a top-emission type. In exemplary embodiments in which the pixel electrode 210 includes a transparent or translucent electrode and the opposite electrode 230 includes a reflective electrode, light emitted from the intermediate layer 220 is emitted towards the substrate 100, and thus, the display apparatus may be a bottom-emission type. However, exemplary embodiments of the present inventive concepts are not limited thereto. For example, in other exemplary embodiments, the display apparatus may be a dual emission-type display apparatus that emits light towards both a top surface and a rear surface of the display apparatus.

The opposite electrode 230 may be disposed only within the pixel area PA in the display area DA and may not be disposed in the transmissive area TA. The opposite electrode 230 may be disposed on upper portions of the intermediate layer 220 and the insulating layer 120. For example, as shown in the embodiment of FIG. 4A, the opposite electrode 230 may be disposed directly on (e.g., in the Z direction) the intermediate layer 220 and the insulating layer 120. The opposite electrode 230 may be consecutively formed over a plurality of light-emitting diodes OLED (e.g., in the Y direction) and may overlap the pixel electrodes 210 (e.g., in the Z direction).

As shown in the embodiment of FIG. 4A, the insulating layer 120 and the multilayer 110 which may include the buffer layer 111, the gate insulating layer 113, the interlayer insulating layer 115 and the planarization layer 117, may be completely or partially removed from the transmissive area TA. For example, the layers may be initially formed on the transmissive area TA and then removed or may not be formed at all.

Although not illustrated, layers that are removed to form the transmissive area TA may include an open portion for defining the transmissive area TA. The open portion may be an opening corresponding to a shape of the transmissive area TA.

As illustrated in FIG. 4A, upper layers excluding the buffer layer 111 may be removed from the transmissive area TA. However, in other exemplary embodiments, the buffer layer 111 may also be removed from the transmissive area TA. As shown in the alternative embodiment of FIG. 4B, the multilayer 110, which includes the buffer layer 111, the gate insulating layer 113, the interlayer insulating layer 115, and the planarization layer 117, may be included in the transmissive area TA and may be arranged similarly to the multilayer 110 in the transmissive area TA. However, the insulating layer 120 may be removed and the light-emitting diode OLED may not be formed. As described above, in the transmissive area TA, the multilayer 110 and the insulating layer 120 may be completely or partially removed, and a conductive layer, for example, an electrode or a line, which includes metal, may not be disposed. Since the conductive layer is not disposed in the transmissive area TA, a high transmittance of the transmissive area TA may be maintained to at least a certain extent.

However, to ensure that a high transmittance of the transmissive area TA is maintained, the opposite electrode 230 may not be disposed within the transmissive area TA. For example, in a comparative example of a general display structure, an opposite electrode may be integrally formed in the entire display area and may be disposed within both the transmissive area and the pixel area. In this comparative example, the opposite electrode is formed in the transmissive area, and thus the transmittance of the transmissive area degrades. Therefore, in accordance with an embodiment of the present inventive concepts, the opposite electrode 230 may be disposed only in the pixel area PA and is not disposed in the transmissive area TA to prevent a decrease in light/sound transmittance in the transmissive area.

In an embodiment, a mask including an opening corresponding to the pixel area may be used to form the opposite electrode 230. However, in this embodiment, a shadow effect may occur which results in the depositing of the deposition material that forms the opposite electrode in the transmissive area that is adjacent to the pixel area through a space between the insulating layer (e.g., the pixel-defining layer) and the mask. The forming of a portion of the opposite electrode 230 in the transmissive area TA causes the transmittance of the transmissive area to degrade and the width of the transmissive area to narrow. Therefore, the light transmittance of the entire display area included as a transparent display may be degraded.

According to an embodiment of the present inventive concepts, the display apparatus 1 includes a first partition wall (PW1 of FIG. 6) and a second partition wall (PW2 of FIG. 6) that are formed on the insulating layer 120 to prevent a deposition material forming the opposite electrode 230 from being deposited within the transmissive area TA.

Figure 5:
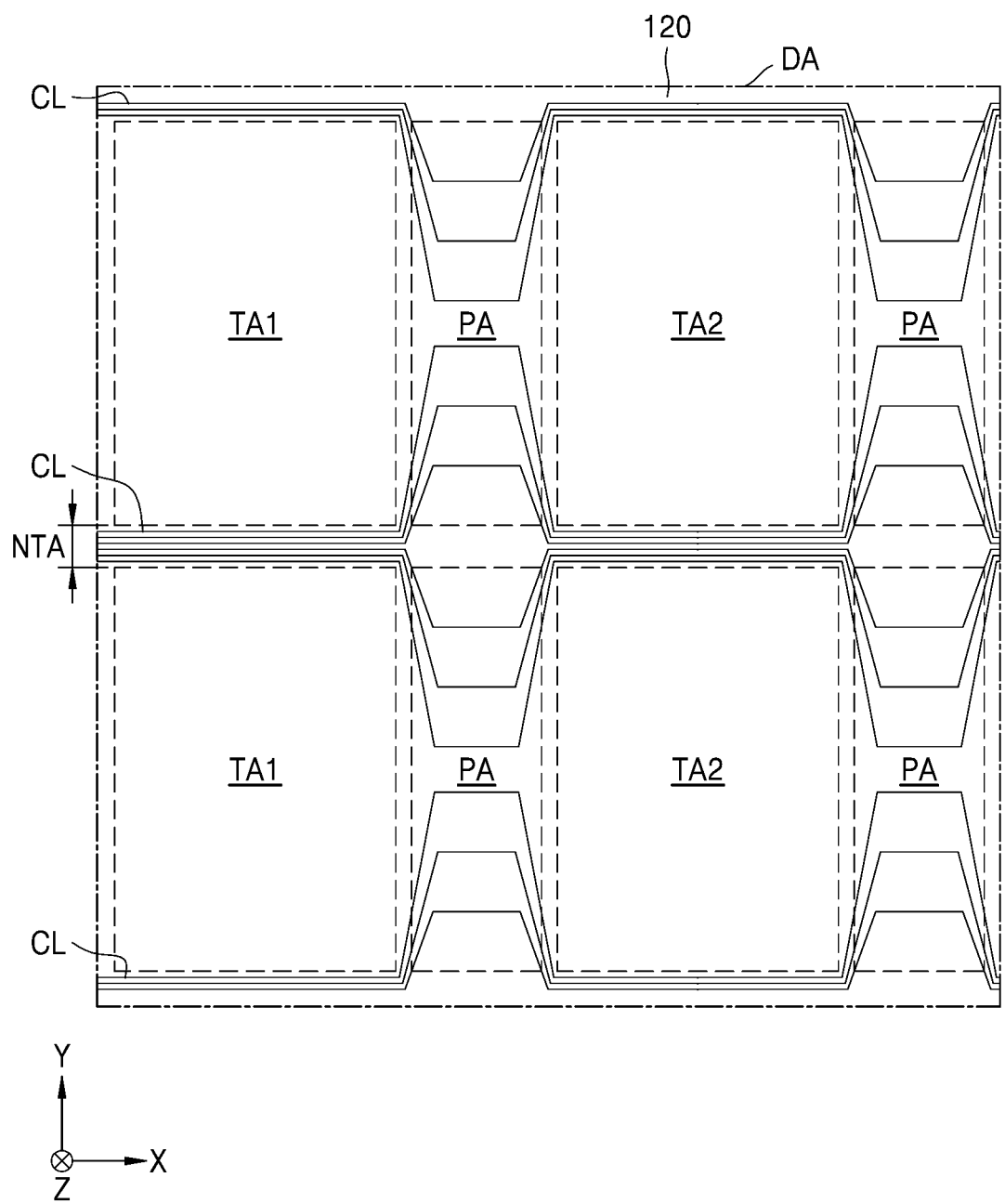
FIG. 5 is a top plan view of part of a display area, according to an embodiment of the present inventive concepts.
Figure 6:
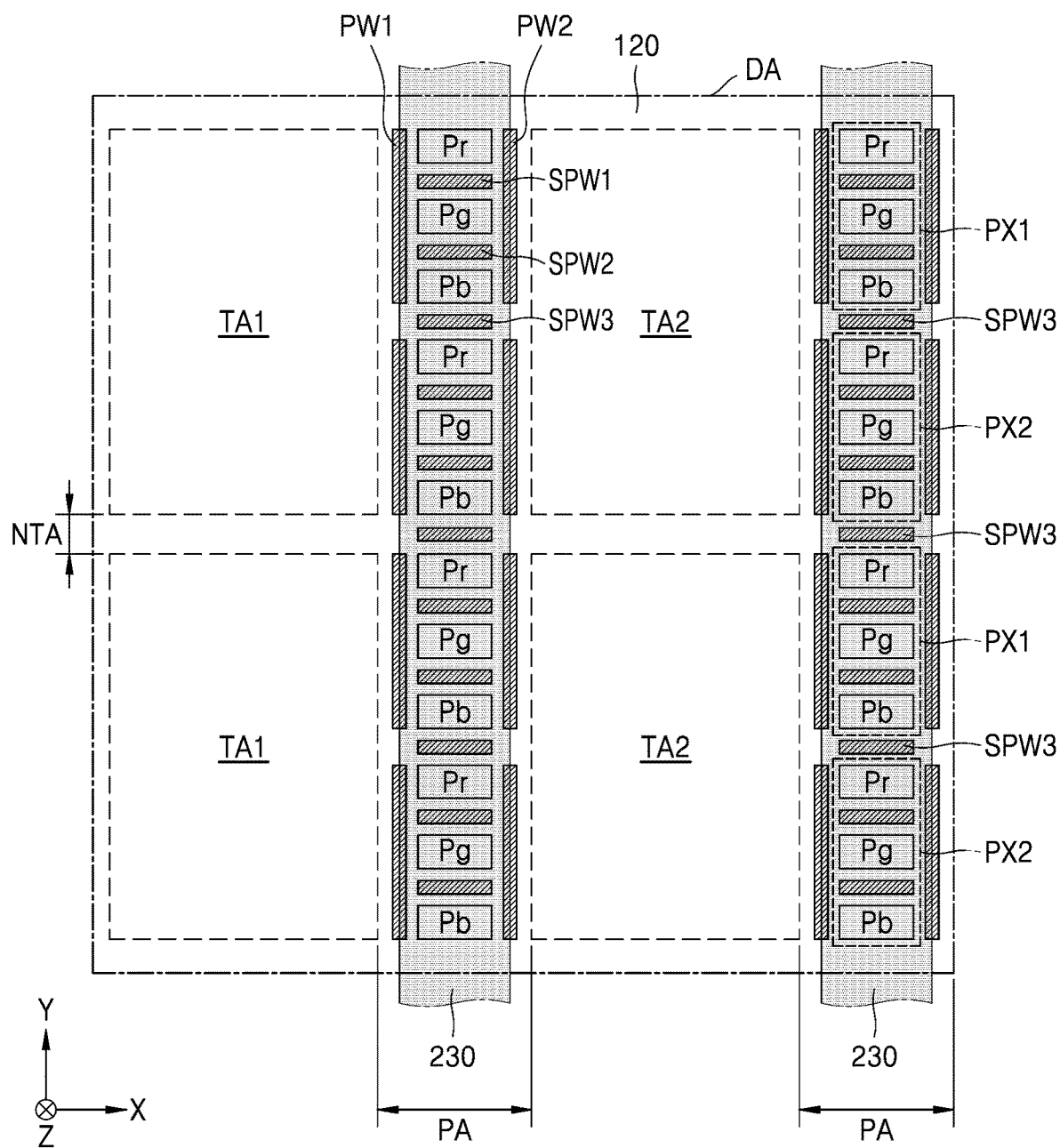
FIG. 6 is a top plan view of a structure in which light-emitting diodes are arranged in the display area of FIG. 5 according to an embodiment of the present inventive concepts.

FIG. 5 is a schematic plan view of portion of the display area, according to an exemplary embodiment. FIG. 6 is a schematic plan view of a structure in which light-emitting diodes are arranged in the display area of FIG. 5 according to an exemplary embodiment.

Referring to FIG. 5, the display area DA includes a first transmissive area TA1, a second transmissive area TA2, and a pixel area PA therebetween. In other words, the first transmissive area TA1, the second transmissive area TA2, and the pixel area PA may be alternately arranged by forming a certain pattern.

As shown in the embodiment of FIG. 5, the first transmissive area TA1, the pixel area PA, the second transmissive area TA2, and the pixel area PA may be arranged in the X direction. However, exemplary embodiments of the present inventive concepts are not limited thereto. The first transmissive area TA1 and the second transmissive area TA2 are defined as areas respectively arranged on one side and the other side with respect to the pixel area PA and may have shapes and structures that are substantially the same. For example, as shown in the embodiment of FIG. 5, the first transmissive area TA1 may be disposed on the left side of the pixel area PA (e.g., in the X direction) and the second transmissive area TA2 may be disposed on the right side of the pixel area PA (e.g., in the X direction).

The display apparatus 1 may include a plurality of first transmissive areas TA1, pixel areas PA, and second transmissive areas TA2. For example, as shown in the embodiment of FIG. 5, the plurality of first transmissive areas TA1, pixel areas PA and second transmissive areas TA may be arranged in the Y direction. As shown in the embodiment of FIG. 5, the non-transmissive area NTA may be disposed between adjacent first transmissive areas TA1 in the Y direction. Likewise, the non-transmissive area NTA may be disposed between adjacent second transmissive areas TA2 in the Y direction.

In an exemplary embodiment, lines CL that supply signals and power to the light emitting diodes arranged in the pixel area PA may be disposed in the non-transmissive area NTA. In an exemplary embodiment, the lines CL may be, for example, scan lines SL, emission control lines EL, previous scan lines SL-1, and the like, which extend in the X direction. However, exemplary embodiments of the present inventive concepts are not limited thereto.

In a comparative embodiment, the lines CL extend in a straight line (e.g., in the X direction) and may extend within the first transmissive area TA1 and the second transmissive area TA2. In this comparative embodiment, the transmittance of the first transmissive area TA1 and the second transmissive area TA2 degrades due to the lines CL. However, in the embodiment shown in FIG. 5, the lines CL may be arranged to bypass the first transmissive area TA1 and the second transmissive area TA2 and be disposed mainly in the non-transmissive area NTA.

Figure 11:
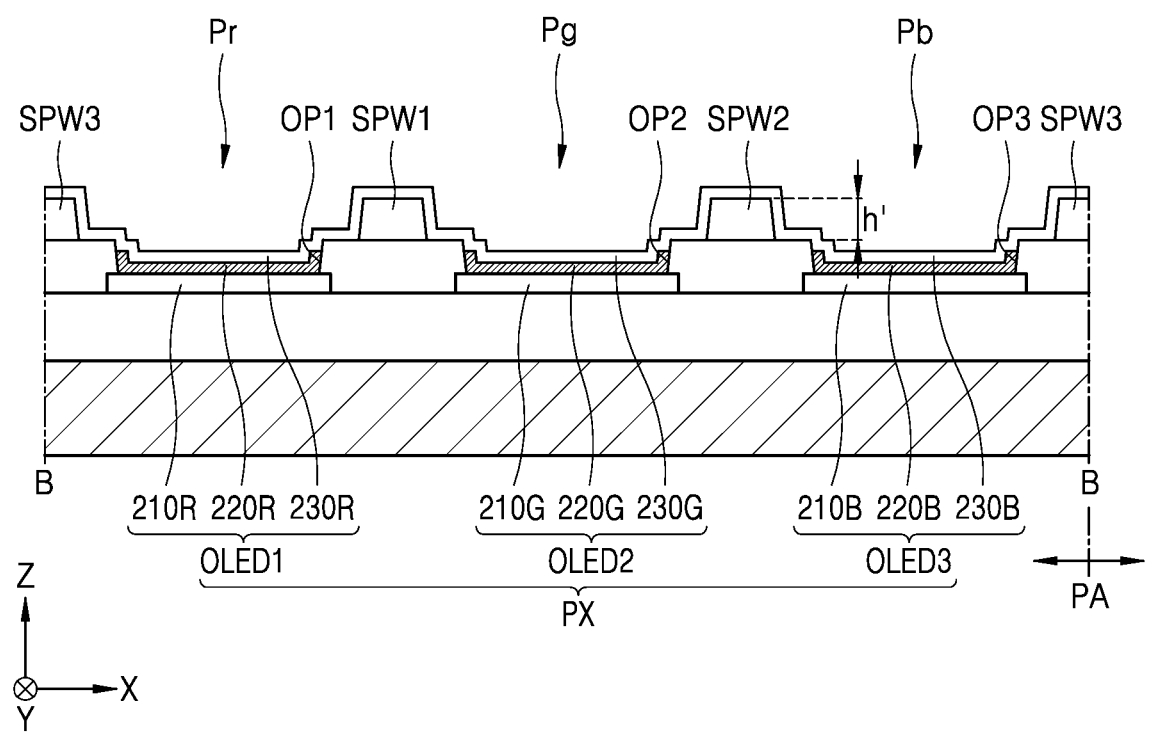
FIG. 11 is a cross-sectional view of the portion of the display area taken along a line B-B' of FIG. 7 according to an embodiment of the present inventive concepts.

Referring to FIG. 6, sub-pixels Pr, Pg, and Pb may be arranged in the pixel area PA. In an exemplary embodiment, the sub-pixels Pr, Pg, and Pb may respectively include a first sub-pixel Pr emitting light of a first color, a second sub-pixel Pg emitting light of a second color, and a third sub-pixel Pb emitting light of a third color. For example, the first color may be red, the second color may be green, and the third color may be blue. However, exemplary embodiments of the present inventive concepts are not limited thereto. As shown in FIG. 11, the first sub-pixel Pr includes a first light-emitting diode OLED1, the second sub-pixel Pg includes a second light-emitting diode OLED2 and the third sub-pixel Pb includes a third light-emitting diode OLED3.

At least one pixel portion PX which is a pixel unit that includes an adjacent first sub-pixel Pr, second sub-pixel Pg and third sub-pixel Pb may be arranged in the pixel area PA. As shown in the embodiment of FIG. 6, a plurality of pixel portions PX such as a first pixel portion PX1 and a second pixel portion PX2 may be disposed in the pixel area PA.

The first partition wall PW1 and the second partition wall PW2 may be arranged in the pixel area PA. A first supportive partition wall SPW1, a second supportive partition wall SPW2, and a third supportive partition wall SPW3 may also be arranged in the pixel area PA. The first and second partition walls PW1 and PW2 and the first to third supportive partition walls SPW1 to SPW3 may be arranged on the insulating layer 120.

As shown in the embodiment of FIG. 6, the first and second partition walls PW1 and PW2 may be disposed in the pixel area PA between the first and second pixel portions PX1, PX2 and the first and second transmissive areas TA1 and TA2. For example, as shown in the embodiment of FIG. 6, a first partition wall PW1 and second partition wall PW2 may each be disposed on lateral sides of the first pixel portion PX1 and the second pixel portion PX2 (e.g., in the X direction). The first and second partition walls PW1 and PW2 may extend in the Y direction and may be arranged in the X direction.

The first to third supportive partition walls SPW1 to SPW3 are disposed between each of the sub-pixels Pr, Pg, and Pb included in the first pixel portion PX1 and the second pixel portion PX2. The first to third supportive partition walls SPW1 to SPW3 may extend in the X direction and may be arranged in the Y direction.

Hereinafter, referring to FIG. 7, the first and second partition walls PW1 and PW2 and the first to third supportive partition walls SPW1 to SPW3 will be described in detail.

Figure 7:
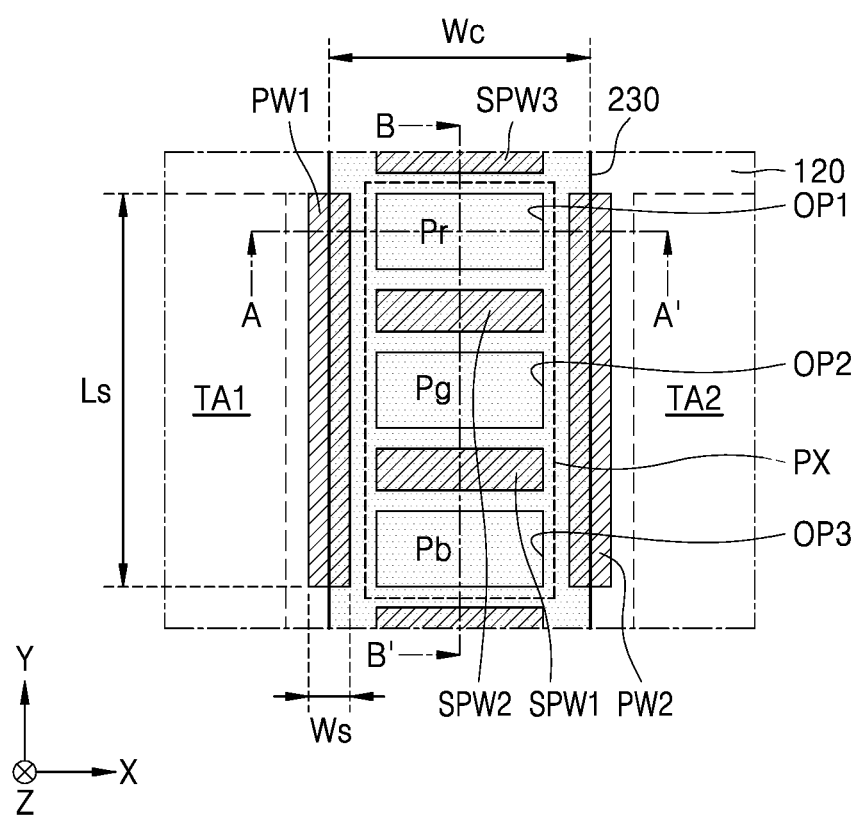
FIG. 7 is a top plan view showing an enlarged portion of the display area of FIG. 5 according to an embodiment of the present inventive concepts.
Figure 8:
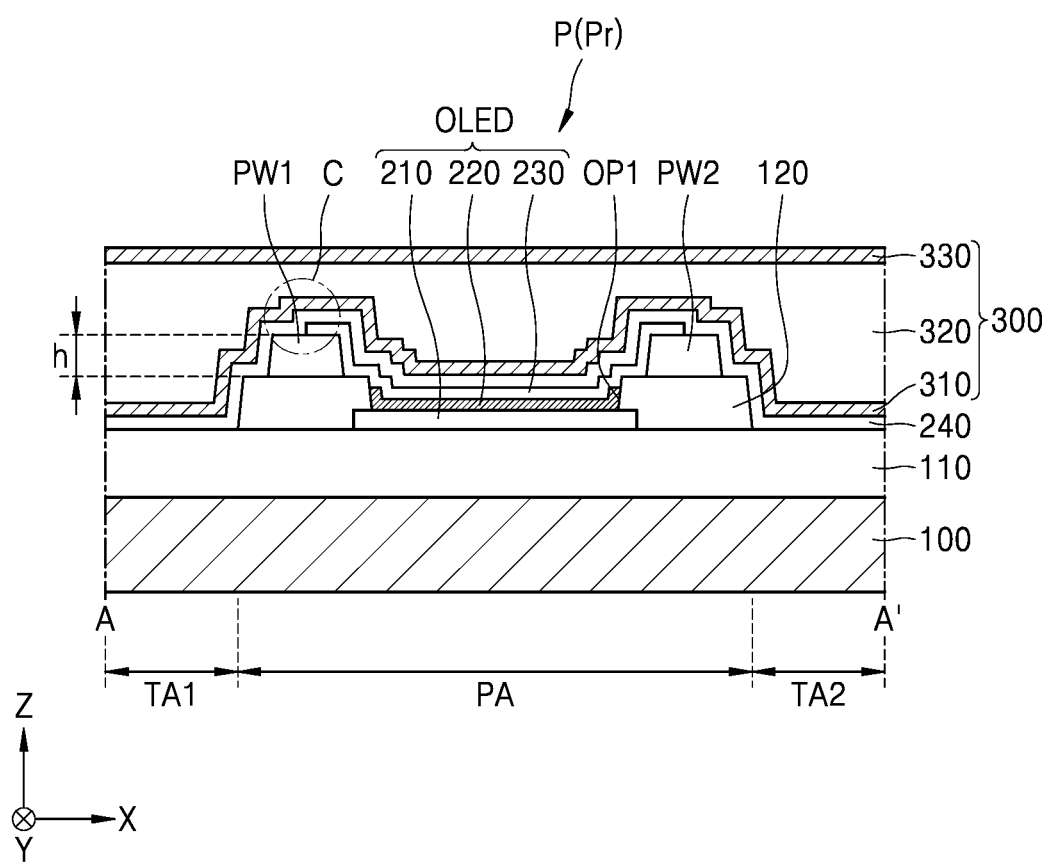
FIG. 8 is a schematic cross-sectional view of the portion of the display area taken along line A-A' of FIG. 7 according to an embodiment of the present inventive concepts.
Figure 9:
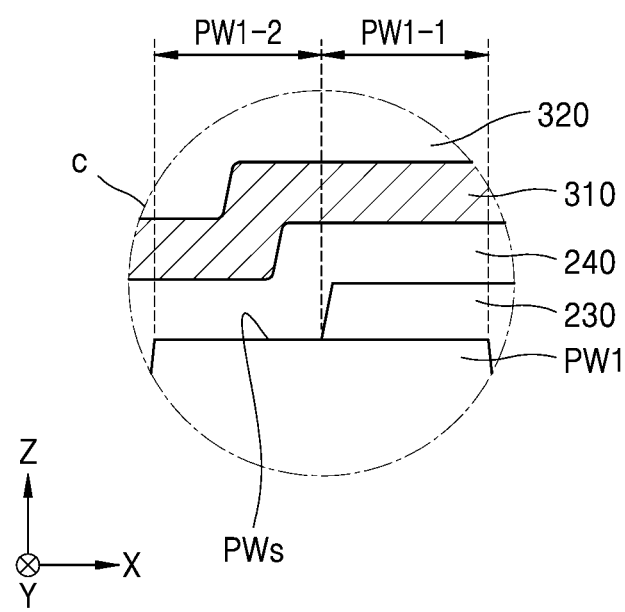
FIG. 9 is an enlarged view of a portion C of FIG. 8 according to an embodiment of the present inventive concepts.

FIG. 7 is a schematic plan view showing an enlarged portion of the display area of FIG. 5, FIG. 8 is a schematic cross-sectional view of the portion of the display area taken along a line A-A' of FIG. 7, and FIG. 9 is an enlarged view of a region C of FIG. 8.

Referring to FIG. 7, the first partition wall PW I is disposed on the insulating layer 120 between the pixel portion PX and the first transmissive area TA1 (e.g., in the X direction). The second partition wall PW2 is disposed on the insulating layer 120 between the pixel portion PX and the second transmissive area TA2 (e.g., in the X direction).

A first opening OP1 defining a first emission area of the first sub-pixel Pr, a second opening OP2 defining a second emission area of the second sub-pixel Pg, and a third opening OP3 defining a third emission area of the third sub-pixel Pb may be defined in the insulating layer 120. With respect to the first sub-pixel Pr, the first partition wall PW1 may be on the insulating layer 120 between the first opening OP1 and the first transmissive area TA1 (e.g., in the X direction).

The first partition wall PW1 and the second partition wall PW2 may extend in the Y direction. For example, the first partition wall PW1 may extend in the Y direction from a space between the third opening OP3 and the first transmissive area TA1 to a space between the second opening OP2 and the first transmissive area TA1. Likewise, the second partition wall PW2 may extend in the Y direction from a space between the third opening OP3 and the second transmissive area TA2 to a space between the second opening OP2 and the second transmissive area TA2.

Figure 12:
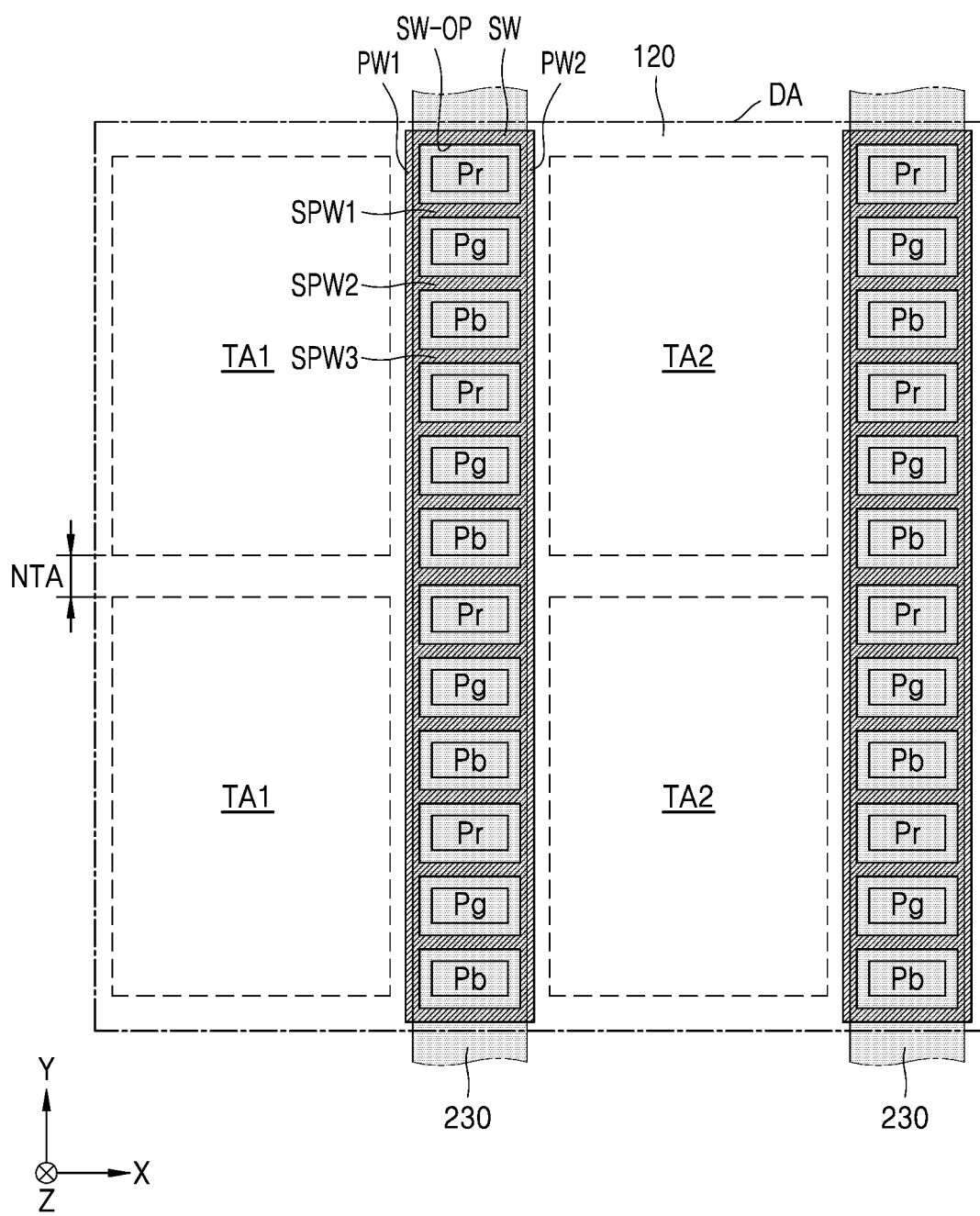
FIGS. 12 and 13 are top plan views of a display area according to exemplary embodiments of the present inventive concepts.

In an exemplary embodiment, a length Ls of the first partition wall PW1 in the Y direction may be less than or equal to about 300 μm. For example, the length Ls may be preferably between about 130 μm and about 140 μm. A length of the second partition wall PW2 (e.g., in the Y direction) may be the same as the length Ls of the first partition wall PW1. FIG. 7 illustrates that the lengths Ls of the first partition wall PW1 and the second partition wall PW2 correspond to a width of the pixel portion PX in the Y direction. However, exemplary embodiments of the present inventive concepts are not limited thereto. Referring to FIGS. 6 and 7, the first partition wall PW1 and the second partition wall PW2 may be spaced apart a certain distance (e.g., in the Y direction) to respectively correspond to the length of the first pixel portion PX1 and the second pixel portion PX2 (e.g., in the Y direction) and the first partition wall PW1 and second partition wall PW2 do not extend in the space between the first and second pixel portions PX1, PX2. However, in another embodiment shown in FIG. 12, the first partition wall PW1 and the second partition wall PW2 may continuously extend in the Y direction as illustrated in FIG. 12 and extend between the pixel portions PX. However, in exemplary embodiments of the present inventive concepts, the first partition wall PW1, second partition PW2 and the first to third supportive partition walls SPW1-SPW3 may have various different numbers and arrangements.

In an exemplary embodiment, a width Ws of the first partition wall PW1 in the X direction may be less than or equal to about 30 μm. For example, in an exemplary embodiment, the width Ws of the first partition wall PW1 in the X direction may be between about 5 μm and about 10 μm. The width of the second partition wall PW2 (e.g., in the X direction) may be the same as the width Ws of the first partition wall PW1.

The first supportive partition wall SPW1 may be disposed on the insulating layer 120 between the first opening OP1 defining the first emission area and the second opening OP2 defining the second emission area (e.g., in the Y direction). The second supportive partition wall SPW2 may be disposed on the insulating layer 120 between the second opening OP2 defining the second emission area and the third opening OP3 defining the third emission area (e.g., in the Y direction).

The third supportive partition wall SPW3 may be between the pixel portions PX. For example, as shown in the exemplary embodiments of FIGS. 6 and 7, the third supportive partition wall SPW3 may be disposed between the third sub-pixel Pb included in the first pixel portion PX1 and the first sub-pixel Pr included in the second pixel portion PX2 (e.g., in the Y direction). As a result, the first supportive partition wall SPW1, the second supportive partition wall SPW2, and the third supportive partition wall SPW3 may be disposed between adjacent openings, such as the first opening OP1, the second opening OP2, and the third opening OP3, respectively.

In an exemplary embodiment, the first and second partition walls PW1 and PW2 and the first to third supportive partition walls SPW1 to SPW3, which are arranged on the insulating layer 120, may include organic or inorganic materials.

In an exemplary embodiment, when the first and second partition walls PW1 and PW2 and the first to third supportive partition walls SPW1 to SPW3 include organic materials, the organic materials may be, for example, a general-purpose polymer including at least one compound selected from BCB, polyimide, HMDSO, PMMA, or PS, a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

In an exemplary embodiment, when the first and second partition walls PW1 and PW2 and the first to third supportive partition walls SPW1 to SPW3 include inorganic materials, the first and second partition walls PW1 and PW2 and the supportive partition walls may include at least one compound selected from silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), etc.

The opposite electrode 230 may be disposed on the insulating layer 120 in the pixel area PA. The opposite electrode 230 may overlap at least some portions of the first partition wall PW1 and the second partition wall PW2 and may not overlap other portions thereof. The opposite electrode 230 may overlap the first to third supportive partition walls SPW1 to SPW3 and may cover the same (e.g., in the Z direction).

With respect to the first pixel portion PX1, the first partition wall PW1 and the second partition wall PW2 may be between the first pixel portion PX1 and the first transmissive area TA1 and may be between the first pixel portion PX1 and the second transmissive area TA2, respectively. The first partition wall PW1 and the second partition wall PW2 prevent the opposite electrode 230 from being formed in the first and second transmissive areas TA1 and TA2 due to the shadow effect, and thus the degradation of the transmittance of the first and second transmissive areas TA1 and TA2 is prevented.

Experimental results of an embodiment of the present inventive concepts indicate that an area of the opposite electrode 230 decreases by about 13% due to the first and second partition walls PW1 and PW2. This indicates that when the first and second partition walls PW1 and PW2 are not formed, a portion of the opposite electrode 230 may be unnecessarily formed in the first and second transmissive areas TA1 and TA2. However, in exemplary embodiments of the present inventive concepts, the opposite electrode 230 may be formed only in the pixel area PA due to the first and second partition walls PW1 and PW2.

In addition, the first supportive partition wall SPW1, the second supportive partition wall SPW2, and the third supportive partition wall SPW3 may prevent the distortion of a color gamut which may be caused as the intermediate layers (e.g., the first, second, and third intermediate layers 220R, 220G, and 220B of FIG. 11) of the sub-pixels (e.g., the first, second, and third sub-pixels Pr, Pg, and Pb) are unnecessarily formed on adjacent light-emitting diodes due to the shadow effect during the formation of the intermediate layers.

Referring to FIG. 8, the multilayer 110 may be disposed on the substrate 100 in the pixel area PA and the first and second transmissive areas TA1 and TA2, and the light-emitting diode OLED may be disposed on the multilayer 110 in the pixel area PA. The insulating layer 120 may cover the edges of the pixel electrode 210 (e.g., lateral edges in the X direction) and may have the opening OP1 defining the emission area of the light-emitting diode OLED by exposing the central portion of the pixel electrode 210. FIG. 8 illustrates that the insulating layer 120 is not disposed in the transmissive area TA. However, exemplary embodiments of the present inventive concepts are not limited thereto.

The first partition wall PW1 and the second partition wall PW2 may be arranged on the insulating layer 120.

In an exemplary embodiment, a height h of the first partition wall PW1 (e.g., length in the Z direction) may be less than or equal to about 3.5 μm. For example, the height h of the first partition wall PW1 may be between about 1 μm and about 2 μm. A height of the second partition wall PW2 (e.g., length in the Z direction) may be the same as the height h of the first partition wall PW1.

The intermediate layer 220 including the emission layer is disposed on the pixel electrode 210. FIG. 8 illustrates that the intermediate layer 220 is disposed only in the opening OP1 of the insulating layer 120 and the intermediate layer 220 is an emission layer.

The opposite electrode 230 may be disposed on the intermediate layer 220. The opposite electrode 230 may extend to upper surfaces of the first partition wall PW1 and the second partition wall PW2 along inner side surfaces of the opening OP1. For example, the opposite electrode 230 may be disposed on a partial portion of the upper surfaces of the first partition wall PW1 and the second partition wall PW2.

A capping layer 240 and the thin film encapsulation layer 300 may be disposed on the opposite electrode 230. In an exemplary embodiment, the capping layer 240 may include an organic material and/or an inorganic material. The thin film encapsulation layer 300 may include a first inorganic encapsulation layer 310, an organic encapsulation layer 320, and a second inorganic encapsulation layer 330, which are sequentially stacked. However, exemplary embodiments of the present inventive concepts are not limited thereto. The organic encapsulation layer 320 is sealed by the first inorganic encapsulation layer 310 and the second inorganic encapsulation layer 330.

The capping layer 240 and the thin film encapsulation layer 300 may be disposed to extend over the entire display area DA (e.g., in the X direction), unlike the opposite electrode 230. For example, the capping layer 240 and the thin film encapsulation layer 300 may extend in the pixel area PA and the first and second transmissive areas TA1 and TA2. Therefore, at least some portions of the capping layer 240 may directly contact upper surfaces of the first partition wall PW1 and the second partition wall PW2.

In an exemplary embodiment, the capping layer 240 may be omitted, and the thin film encapsulation layer 300 may be disposed directly on the opposite electrode 230 (e.g., in the Z direction). In this embodiment, at least some portions of the first inorganic encapsulation layer 310 may directly contact the upper surfaces of the first partition wall PW1 and the second partition wall PW2.

As shown in the embodiment of FIG. 9 which shows the region C of FIG. 8 in more detail, an upper surface PWs of the first partition wall PW1 may include a first portion PW1-1, which is adjacent to the emission area (e.g., in the X direction), and a second portion PW1-2 that is adjacent to the transmissive area TA, such as the first transmissive area TA1 (e.g., in the X direction). The opposite electrode 230 may directly contact the first portion PW1-1 of the upper surface PWs of the first partition wall PW1. The opposite electrode 230 may not contact or overlap the second portion PW1-2 and may have a lateral end disposed in the first portion PW1-1. Therefore, the opposite electrode 230 is not formed on the second portion PW1-2. The second portion PW1-2 may be a portion contacting a mask M described below with reference to FIG. 10.

The opposite electrode 230 may not be disposed on the second portion PW1-2 of the first partition wall PW1. A material layer that is disposed on the opposite electrode 230 may also be disposed on the exposed second portion PW1-2. In an exemplary embodiment, the material layer may be the capping layer 240 which is disposed directly on the opposite electrode 230 and the exposed second portion PW1-2 (e.g., in the Z direction).

In another exemplary embodiment, the capping layer 240 may be omitted, and in this embodiment, the thin film encapsulation layer 300 may be disposed on the opposite electrode 230. In this embodiment, the material layer disposed directly on the opposite electrode 230 and the exposed second portion PW1-2 of the first partition wall PW1 may be the first inorganic encapsulation layer 310 of the thin film encapsulation layer 300.

Figure 10:
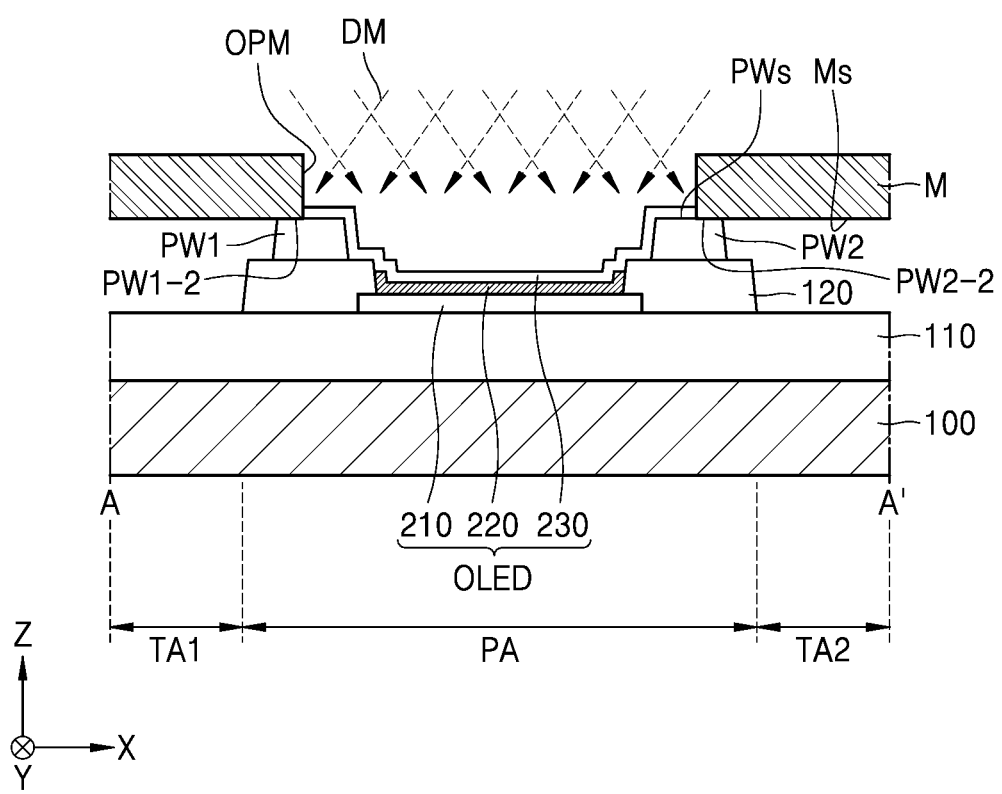
FIG. 10 is a cross-sectional view taken along line A-A' of FIG. 7 showing a manufacturing processes according to an embodiment of the present inventive concepts.

FIG. 10 is a cross-sectional view showing one of the manufacturing processes according to an exemplary embodiment. FIG. 10 illustrates a process of manufacturing the opposite electrode 230.

Referring to FIG. 10, the mask M may include an open region OPM corresponding to the pixel area PA. The open region OPM of the mask M may have a width (e.g., length in the X direction) that is identical to or less than the pixel area PA. A deposition material DM forming the opposite electrode 230 is deposited on the intermediate layer 220 through the open region OPM of the mask M.

While the opposite electrode 230 is deposited, the mask M may be supported by the first partition wall PW1 and the second partition wall PW2. For example, the mask M may be supported by second portions PW1-2, PW2-2 of the first and second partition walls. As illustrated in FIG. 10, a lower surface Ms of the mask M may contact the upper surfaces of the second portions PW1-2, PW2-2 of the first partition wall PW1 and the second partition wall PW2. As the lower surface Ms of the mask M contacts the upper surfaces of the first partition wall PW1 and the second partition wall PW2, the deposition material DM may be deposited only in the pixel area PA, and the opposite electrode 230 may be formed only in the pixel area PA.

FIG. 11 is a schematic cross-sectional view of the part of the display area taken along a line B-B' of FIG. 7.

Referring to FIGS. 7 and 11, the pixel portion PX may be disposed in the pixel area PA, and the pixel portion PX may include the first sub-pixel Pr including the first light-emitting diode OLED1, the second sub-pixel Pg including the second light-emitting diode OLED2, and the third sub-pixel Pb including the third light-emitting diode OLED3.

The first light-emitting diode OLED1 emitting light of the first color may include a first pixel electrode 210R, a first intermediate layer 220R, and a first opposite electrode 230R. The second light-emitting diode OLED2 emitting light of the second color may include a second pixel electrode 210G, a second intermediate layer 220G, and a second opposite electrode 230G. The third light-emitting diode OLED3 emitting light of the third color may include a third pixel electrode 210B, a third intermediate layer 220B, and a third opposite electrode 230B.

The first supportive partition wall SPW1 may be disposed on the insulating layer 120 between the first opening OP1 defining the first emission area of the first light-emitting diode OLED1 and the second opening OP2 defining the second emission area of the second light-emitting diode OLED2 (e.g., in the Y direction). The second supportive partition wall SPW2 may be on the insulating layer 120 between the second opening OP2 defining the second emission area and the third opening OP3 defining the third emission area of the third light-emitting diode OLED3 (e.g., in the Y direction).

The third supportive partition wall SPW3 may be on the insulating layer 120 between the pixel portions PX. For example, as shown in the embodiment of FIGS. 6 and 7, the third supportive partition wall SPW3 may be between the third sub-pixel Pb of the first pixel portion PX1 and the first sub-pixel Pr of the second pixel portion PX2 (e.g., in the Y direction). Thus, the first to third supportive partition walls SPW1 to SPW3 may be between the adjacent openings (e.g., the first opening OP1, the second opening OP2, and the third opening OP3), respectively.

In an embodiment, heights h' (e.g., length in the Z direction) of the first to third supportive partition walls SPW1 to SPW3 may be the same. However, exemplary embodiments of the present inventive concepts are not limited thereto. The heights h' of the first to third supportive partition walls SPW1 to SPW3 may be differently formed according to the sizes of and spaces between respective openings (e.g., the first to third openings OP1 to OP3). The heights h' of the first to third supportive partition walls SPW1 to SPW3 may also be less than heights h of the first and second partition walls PW1 and PW2.

The first to third supportive partition walls SPW1 to SPW3 may be disposed between the light-emitting diodes OLED1 to OLED3 and may prevent a defect that the first, second, and third intermediate layers 220R, 220G, and 220B overlap emission areas of adjacent light-emitting diodes and be deposited thereon.

Figure 13:
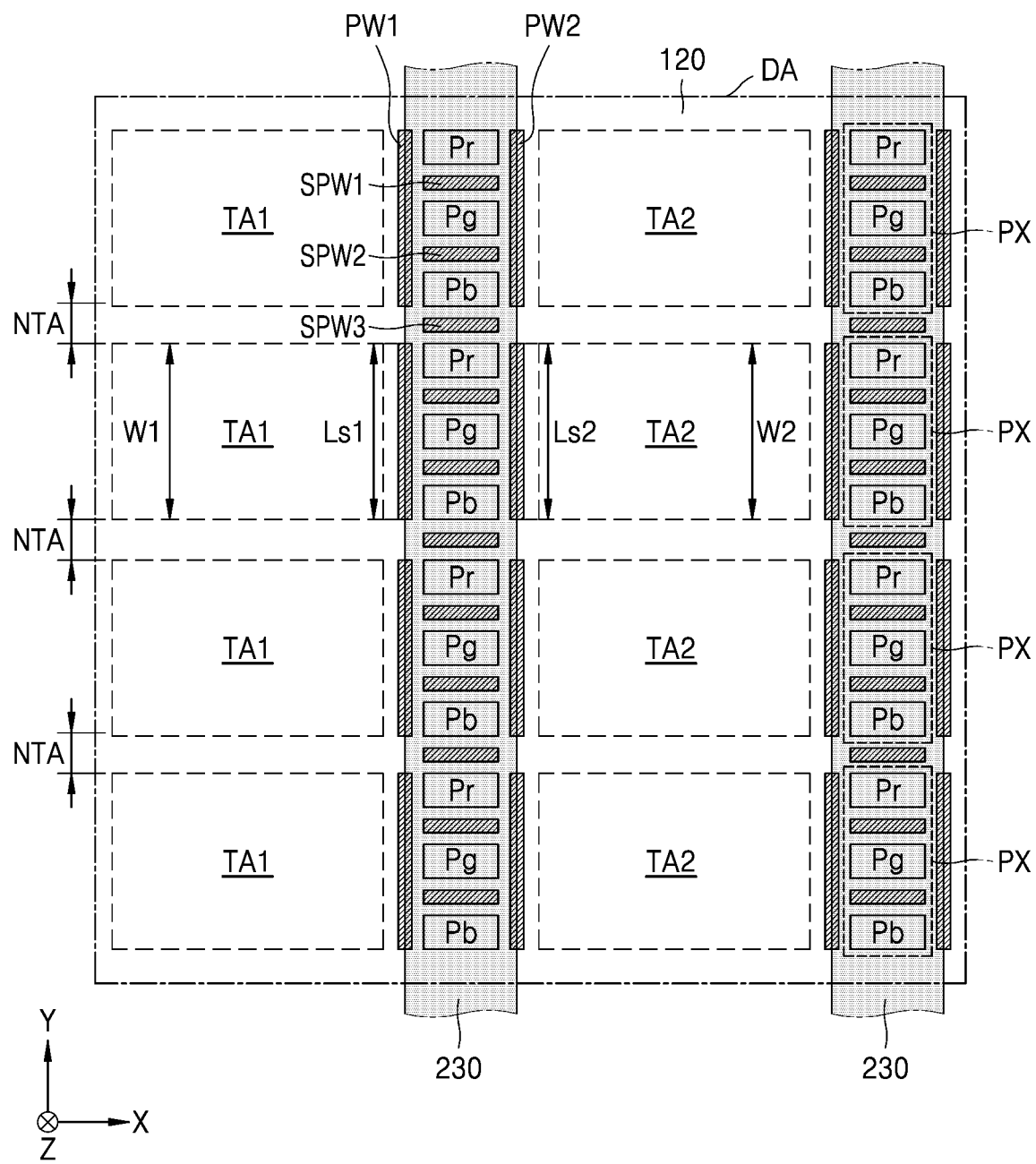

FIGS. 12 and 13 are schematic plan views of the display area according to exemplary embodiments. FIGS. 12 and 13 respectively illustrate modified exemplary embodiments of FIG. 6.

A structure of the partition wall PW of FIG. 12 is different from that of FIG. 6. Hereinafter, the descriptions provided with reference to FIG. 6 will not be repeated, and a difference between FIGS. 6 and 12 will be mainly described.

Similarly to FIG. 6, the partition wall PW of FIG. 12 may include the first and second partition walls PW1 and PW2 extending in the Y direction and the first to third supportive partition walls SPW1 to SPW3 extending in the X direction. FIG. 12 illustrates that the first partition wall PW1 and the second partition wall PW2 are not spaced apart from each other in the non-transmissive area NTA and may be integrally formed. The first to third supportive partition walls SPW1 to SPW3 may extend in the X direction and may be connected to the first partition wall PW1 and the second partition wall PW2.

The supportive partition walls (e.g., the third supportive partition wall SPW3) of FIG. 12 may include openings SW-OP surrounding outer regions of respective sub-pixels (e.g., the first, second, and third sub-pixels Pr, Pg, and Pb). Because of the supportive partition walls SW, intermediate layers (e.g., emission layers) respectively included in the sub-pixels Pr, Pg, and Pb are not unnecessarily formed in emission areas of other adjacent sub-pixels Pr, Pg, and Pb and thus may not overlap the same during the manufacture. Also, because of the partition wall PW, the opposite electrode 230 is not unnecessarily formed in the transmissive area TA during the manufacture and thus may not overlap the same, thereby being formed only in the pixel area PA.

As shown in the embodiment of FIG. 13, only one pixel portion PX may be disposed in the pixel area PA between the first transmissive area TA1 and the second transmissive area TA2 in contrast to the embodiment of FIG. 6 in which the pixel area PA of FIG. 6 includes a plurality of pixel portions, such as the first pixel portion PX1 and the second pixel portion PX2.

The first partition wall PW1 and the second partition wall PW2 of FIG. 13 may be adjacent to the first transmissive area TA1 and the second transmissive area TA2, respectively (e.g., in the X direction). A width W1 of the first transmissive area TA1 in the Y direction may be the same as a length Ls1 of the first partition wall PW1 in the Y direction. Likewise, a width W2 of the second transmissive area TA2 in the Y direction may be the same as a length Ls2 of the second partition wall PW2 in the Y direction.

According to the one or more exemplary embodiments of the present inventive concepts, in the display apparatus including the transmissive area in the display area, the transmittance of the display area and the distortion of a color gamut are simultaneously improved. However, the scope of the present inventive concepts are not limited to such effects.

It should be understood that exemplary embodiments described herein should be considered in a descriptive sense only and not for purposes of limitation. Descriptions of features or aspects within each embodiment should typically be considered as available for other similar features or aspects in other exemplary embodiments. While one or more exemplary embodiments have been described with reference to the figures, it will be understood by those of ordinary skill in the art that various changes in form and details may be made therein without departing from the spirit and scope as defined by the following claims.

What is claimed is:

1. A display apparatus comprising:
   a substrate including a first transmissive area, a second transmissive area, and a pixel area between the first transmissive area and the second transmissive area;
   a first pixel electrode in the pixel area;
   a first intermediate layer disposed on the first pixel electrode, the first intermediate layer configured to emit light of a first color;
   an insulating layer covering edges of the first pixel electrode and defining a first emission area through a first opening exposing a portion of the first pixel electrode;
   a first partition wall disposed on the insulating layer between the first emission area and the first transmissive area;

a second partition wall disposed on the insulating layer between the first emission area and the second transmissive area; and an opposite electrode disposed on the first intermediate layer in the pixel area, at least a portion of the opposite electrode contacting the first partition wall and the second partition wall, wherein ends of the opposite electrode terminate on the first partition wall and the second partition wall respectively.

2. The display apparatus of claim 1, wherein upper surfaces of the first partition wall and the second partition wall comprise first portions adjacent to the first emission area and second portions adjacent to the first transmissive area and the second transmissive area, respectively, the first portions contacting the opposite electrode.

3. The display apparatus of claim 2, wherein the second portions do not contact or overlap with the opposite electrode.

4. The display apparatus of claim 2, further comprising a material layer disposed on the opposite electrode, wherein the material layer directly contacts the second portions.

5. The display apparatus of claim 1, further comprising:
a second pixel electrode that is spaced apart from the first pixel electrode in the pixel area in a first direction;
a second intermediate layer disposed on the second pixel electrode, the second intermediate layer configured to emit light of a second color;
a third pixel electrode that is spaced apart from the second pixel electrode in the pixel area in the first direction; and
a third intermediate layer disposed on the third pixel electrode, the third intermediate layer configured to emit light of a third color,
wherein the insulating layer covers edges of the second and third pixel electrodes and defines a second emission area and a third emission area through a second opening and a third opening, respectively, which expose portions of the second and third pixel electrodes, and
the first partition wall extends between the first to third emission areas and the first transmissive area in the first direction.

6. The display apparatus of claim 5, wherein the second partition wall extends between the first to third emission areas and the second transmissive area in the first direction.

7. The display apparatus of claim 5, wherein a length of the first partition wall in the first direction is a same as a length of the second partition wall.

8. The display apparatus of claim 5, wherein widths of the first and second partition walls in the second direction are identical.

9. The display apparatus of claim 8, wherein the lengths of the first and second partition walls in the first direction are less than or equal to about 300 µm and the widths of the first and second partition walls in the first direction are less than or equal to about 30 µm.

10. The display apparatus of claim 8, wherein heights of the first and second partition walls are less than or equal to about 3.5 µm.

11. The display apparatus of claim 5, further comprising a first supportive partition wall disposed on the insulating layer between the first opening and the second opening, the first supportive partition wall extending in the second direction.

12. The display apparatus of claim 11, further comprising a second supportive partition wall disposed on the insulating layer between the second opening and the third opening, the second supportive partition wall extending in the second direction.

13. The display apparatus of claim 12, wherein the opposite electrode covers the first supportive partition wall and the second supportive partition wall.

14. The display apparatus of claim 11, wherein the first supportive partition wall is connected to the first partition wall at a first lateral end and to the second partition wall at a second lateral end.

15. The display apparatus of claim 5, wherein:
at least one pixel portion is disposed in the pixel area, the pixel portion comprising a plurality of light-emitting diodes emitting light of different colors; and
the plurality of light-emitting diodes includes a first light-emitting diode comprising the first pixel electrode, a second light-emitting diode comprising the second pixel electrode, and a third light-emitting diode comprising the third pixel electrode.

16. The display apparatus of claim 15, wherein:
the pixel portion comprises a first pixel portion and a second pixel portion that are spaced apart in the first direction; and
the display apparatus further comprises a third supportive partition wall disposed on the insulating layer between the first pixel portion and the second pixel portion, the third supportive wall extending in the second direction.

17. The display apparatus of claim 16, wherein:
the first partition wall and the second partition wall are respectively arranged to correspond to the first pixel portion and the second pixel portion, and
the first partition wall and the second partition wall do not extend to spaces between the first pixel portion and the second pixel portion in the second direction.

18. The display apparatus of claim 1, further comprising a multilayer disposed between the insulating layer and the substrate and comprising at least one of an organic insulating layer and an inorganic insulating layer,
wherein the multilayer comprises an open region corresponding to the first and the second transmissive areas, respectively.

19. The display apparatus of claim 1, wherein the substrate includes a plurality of first transmissive areas and a plurality of second transmissive areas spaced apart in a first direction with the pixel area disposed between the plurality of first transmissive areas and the plurality of second transmissive areas, the pixel area extending in the first direction, and the opposite electrode is integrally formed in the pixel area between the plurality of first transmissive areas and the plurality of second transmissive areas.

* * * * *